United States Patent [19]

Johnescu et al.

[11] Patent Number: 4,741,703

[45] Date of Patent: May 3, 1988

[54] PCB MOUNTED TRIAXIAL CONNECTOR ASSEMBLY

[75] Inventors: Douglas M. Johnescu, York; George W. Michael, III, Harrisburg; Randolph E. Capp; Ronald C. Laudig, both of Mechanicsburg, all of Pa.

[73] Assignee: AMP Incorporated, Harrisburg, Pa.

[21] Appl. No.: 6,522

[22] Filed: Jan. 23, 1987

Related U.S. Application Data

[63] Continuation-in-part of Ser. No. 895,964, Aug. 12, 1986, abandoned.

[51] Int. Cl.[4] .......... H05K 1/00

[52] U.S. Cl. .......... 439/63; 439/78; 439/581; 439/860; 439/816

[58] Field of Search .......... 339/17, 177, 89 C, 90 C, 339/182, 183, 252, 253, 255, 256, 217 R, 217 S, 220, 221, 18

[56] References Cited

U.S. PATENT DOCUMENTS

| | | | |
|---|---|---|---|
| 3,121,583 | 10/1962 | Damm | 294/83 |
| 3,148,010 | 4/1962 | Woodward | 339/183 |
| 3,493,916 | 2/1970 | Hansen | 339/79 |
| 3,514,737 | 5/1970 | Renshaw, Jr. | 339/17 |
| 3,895,181 | 7/1975 | LaGrange et al. | 339/18 R |
| 4,060,887 | 12/1977 | De Groef | 29/626 |
| 4,175,810 | 11/1979 | Holt et al. | 339/17 C |
| 4,548,453 | 10/1985 | Mummey et al. | 339/177 R |
| 4,598,961 | 7/1986 | Cohen | 339/17 C |
| 4,598,970 | 7/1986 | Takihara | 339/183 R |
| 4,609,242 | 9/1986 | Kemppainen | 339/177 R |

FOREIGN PATENT DOCUMENTS 52-107385 8/1977 Japan .

*Primary Examiner*—Eugene F. Desmond
*Assistant Examiner*—David Pirlot
*Attorney, Agent, or Firm*—Gerald K. Kita

[57] ABSTRACT

An electrical connector assembly (1, 1′, 100) having a conductive exterior shell (16, 16′, 116) and a conductive intermediate shell (41, 41, 141) frictionally engaged by corresponding conductive contacts (49, 49, 149, 149) of the same construction in the form of strip form clips having electrical terminals (52, 52, 152, 152) projecting outwardly of an insulative body (2, 102) that positions the shells (16, 16′, 41, 116, 141) with respect to the openings (14, 114) into which the contacts (49, 49, 149, 149) are inserted for latched engagement with the body (2, 102) and for electrical connection with the corresponding shells (16, 16′, 41, 116, 141).

15 Claims, 7 Drawing Sheets

PCB MOUNTED TRIAXIAL CONNECTOR ASSEMBLY

RELATED APPLICATION

This application is a continuation-in-part of application Ser. No. 895,964, filed Aug. 12, 1986 now abandoned.

FIELD OF THE INVENTION

The invention relates to an electrical connector assembly for mounting on a printed circuit board, PCB, and to an electrical connector of either coaxial or triaxial construction and assembled with electrical contacts for mounting in a PCB, having apertures arranged in a pattern wherein one of the apertures is surrounded by other apertures of the pattern.

BACKGROUND OF THE INVENTION

A locking clasp for an electrical connector is known from U.S. Pat. No. 3,121,583, and from Japanese Patent Publication No. 52-107385, published Aug. 16, 1977. The known locking clasp is retained in a housing that receives the connector for interlocking engagement with the locking clasp. The locking clasp has opposed resilient springs that are resiliently biased to move toward each other to register in a slot on the exterior of the connector and to clamp the connector.

An electrical connector for mounting on a PCB is disclosed in pending U.S. patent application, Ser. No. 748,264, filed June 24, 1985. The known connector includes an electrical contact projecting from a conductive shell of the connector for insertion into an aperture of a PCB. The contact is assembled with the shell prior to assembly of the shell in the connector. The contact is inserted in a recess of the conductive shell and is retained by partial collapse of the shell onto the contact.

SUMMARY OF THE INVENTION

According to an aspect of the invention, by way of example, an electrical connector assembly includes an electrical connector mounted in an interior of an insulative body, and an electrical contact engaging an exterior shell of the connector and projecting from the exterior of the insulative body to provide electrical terminals for insertion into a PCB. The shell of the connector is held by the insulative body in position with respect to an opening in the insulative body. The contact is inserted into the opening and moved toward the connector. The contact has a holder with an open side that faces toward the connector. The open side receives the shell of the connector and resiliently engages and clasps the shell to establish an electrical connection. Electrical terminals project from the holder and latch to the insulative body to retain the contact in the electrical connector assembly. Thus, the construction of the connector assembly provides for ease of assembly of the contact in the insulative body and into electrical connection with the shell of the connector that is already positioned in the connector assembly.

According to another aspect of the invention, by way of example, a connector assembly provides for the assembly of plural electrical contacts, each into a corresponding opening of an insulative body of the connector assembly, and each with a clasp portion to engage and clasp onto a corresponding conductive portion of an electrical connector positioned in the connector assembly. According to another aspect of the invention, by way of example, the corresponding openings are of similar construction, and the corresponding conductive portions of the electrical connector are of similar construction, thereby to be capable of assembly with a corresponding one of plural electrical contacts of similar form and construction.

According to another aspect of the invention, by way of example, an electrical connector assembly includes an electrical connector, electrical contacts that engage corresponding conductive portions of the connector and electrical terminals of the contacts that project outwardly from the connector in a common direction and are spaced apart from one another, and the terminals are arranged in a pattern wherein one of the terminals is surrounded by the other terminals, and said other terminals provide electrical shunts for absorbing radiant electrical energy in the form of electrical signals emitted from the surrounded terminal or in the form of electrical interference that interferes with electrical signals transmitted along the surrounded terminal.

An object of the invention is to provide an electrical connector assembly with an electrical connector, electrical contacts and electrical terminals of the contacts that project outwardly from the connector in a common direction and arranged in a pattern wherein one of the terminals is surrounded by the other terminals.

An object of the invention is to provide an electrical connector assembly including an insulative body, an electrical connector and with means providing for ease of assembly of an electrical contact with the body and in electrical engagement with the connector.

Another object of the invention is to provide an electrical connector assembly including an insulative body having an interior that holds an electrical connector in position over an opening in the insulative body into which an electrical contact is inserted for clasped engagement with a conductive shell of the connector and for latched engagement with the insulative body.

Another object of the invention is to provide an electrical connector assembly that provides for the assembly of plural electrical contacts of similar form and construction, and constructed for insertion into corresponding openings of an insulative body of the connector assembly, and with clasp portions to engage and clasp onto corresponding conductive portions of similar form and construction and provided on an electrical connector positioned in the connector assembly.

Other advantages of the invention are apparent from a detailed description, that follows, and from drawings that accompany the description.

DESCRIPTION OF THE INVENTION

Figure 1:
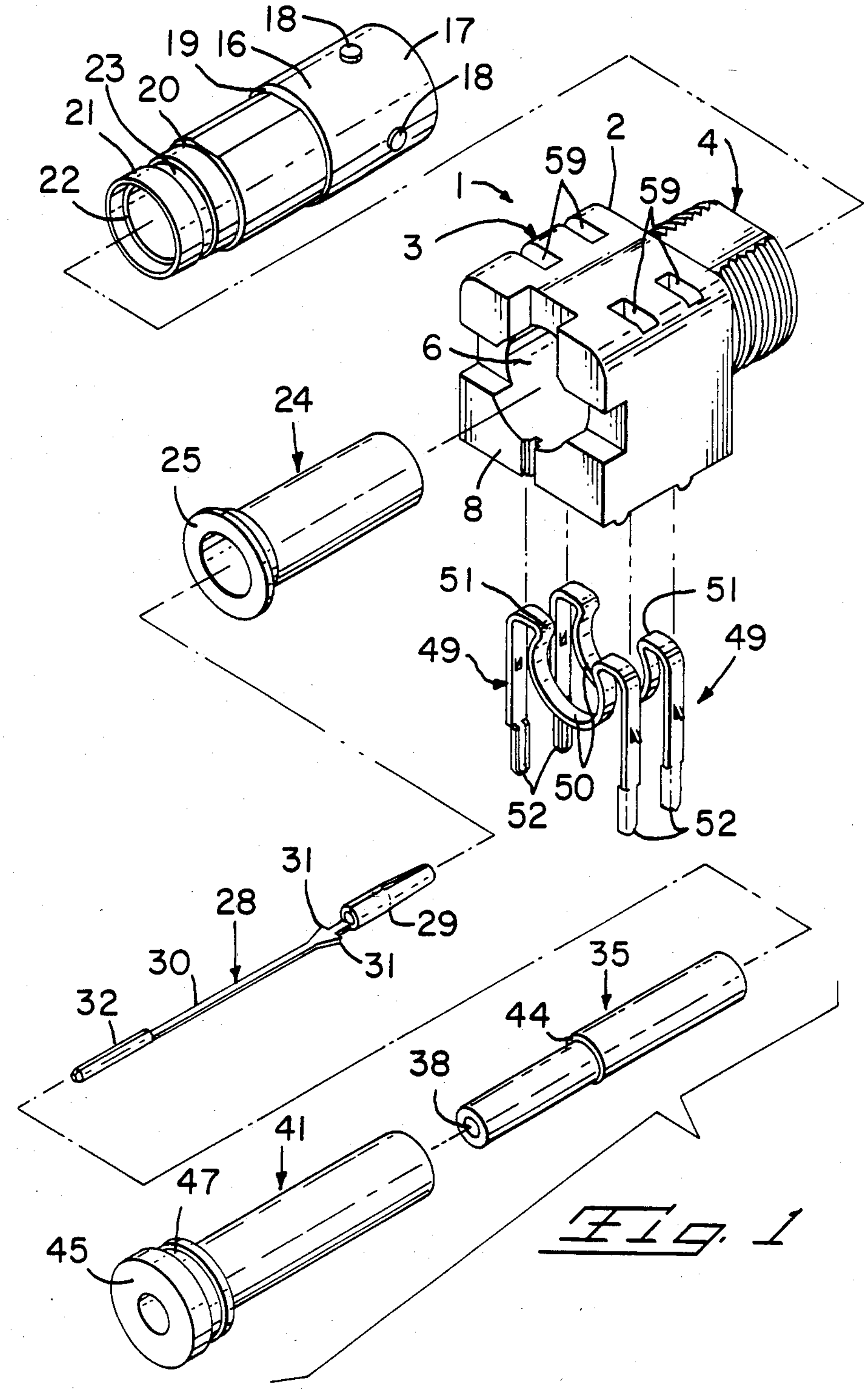
FIG. 1 is an enlarged perspective view of an electrical connector assembly of triaxial configuration and with parts in exploded configuration.

FIGS. 1 through 4 of the drawings show an electrical connector assembly 1. An insulative body 2 of the assembly 1 is fabricated, for example, by moulding a polymeric plastics material, and includes a hollow rectangular portion 3 that is integral with a hollow cylindrical portion 4. External threads 5 are on the cylindrical portion 4 for establishing a threaded connection to a panel, not shown. The body 2 has a cylindircal hollow interior portion 6 extending axially through an open end 7 of the cylindrical portion 4 and through an open end 8 of the rectangular portion 3. A radially projecting interior shoulder 9 on the body 2 faces toward the open end 7 of the cylindrical portion 4. A radially inclined projecting interior shoulder 10 faces toward the open end 8 of the rectangular portion 3.

One exterior wall 11 of the rectangular portion 3 provides a base 11 having projecting feet 12 for standing against a PCB 13. A pair of spaced apart openings 14, 14 of similar construction communicate with the wall 11 and the interior portion 6.

The assembly 1 further includes a triaxial electrical connector 15 having a hollow and conductive exterior shell 16 of stepped cylindrical form for assembly into the open end 7 of the cylindrical portion 4 of the body 2. The exterior shell 16 has a disconnect coupling portion 17 provided with bayonet coupling prongs 18 for disconnect coupling with a complementary electrical connector, not shown. The exterior shell 16 further has an exterior and radially projecting shoulder 19 engaged against the end 7 and a second exterior radially projecting shoulder 20 engaged against the interior shoulder 9 to limit the extent of insertion into the body 2.

Figure 3:
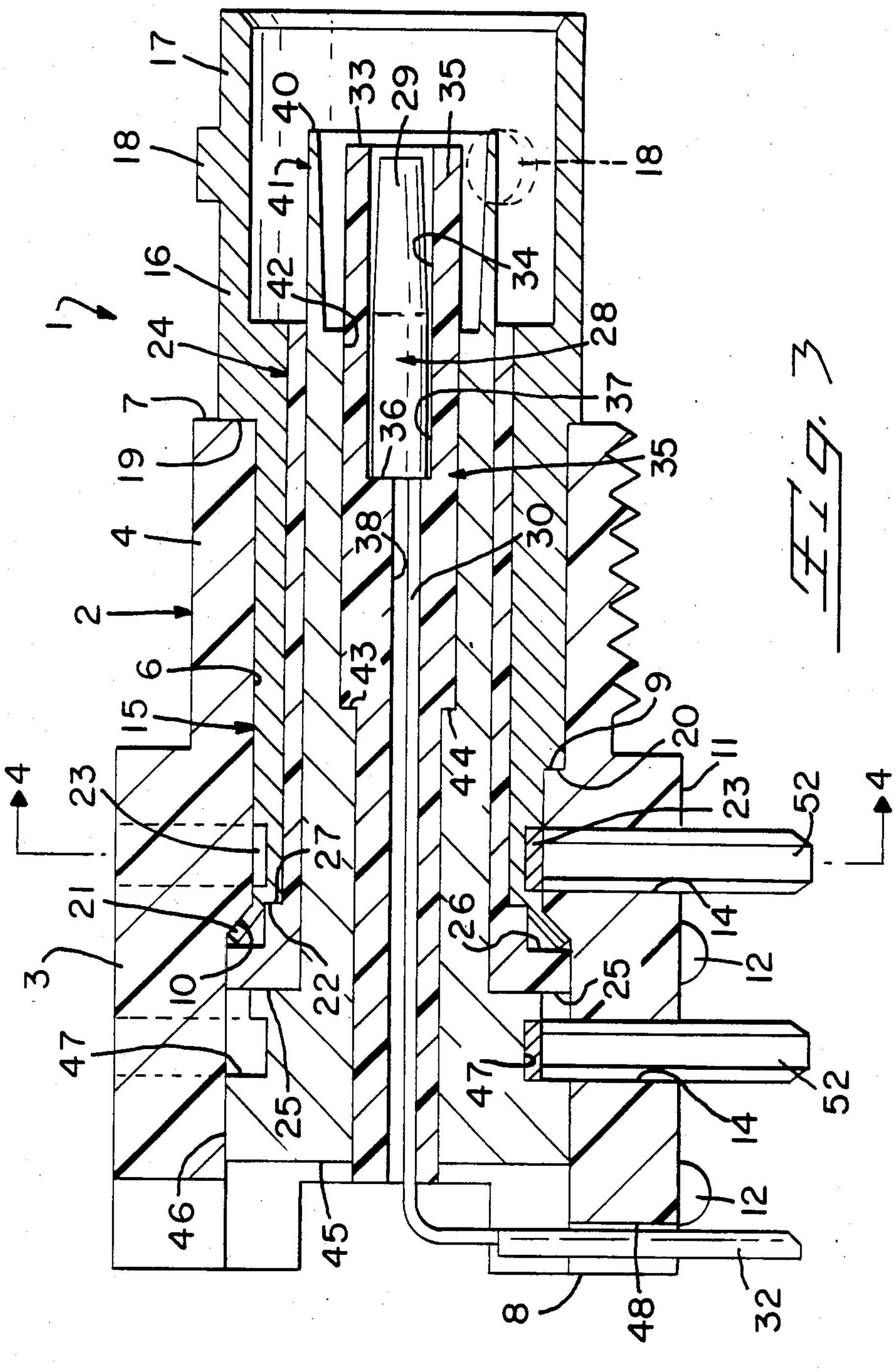
FIG. 3 is an enlarged longitudinal section view of the assembly shown in FIG. 2.

As shown in FIG. 1, a rear end 21 of the shell 16 is of reduced cylindrical thickness and projects axially from an internal cylindrical shoulder 22 at the junction of the reduced thickness with the increased thickness of the remainder of the shell 16. As shown in FIG. 3, the rear end 21 is flared to form a radially outwardly flared lip engaged against the inclined shoulder 10 to prevent axial movement of the shell 16 toward the open end 7 of the cylindrical portion 4. A recess 23 of groove form encircles the cylindrical exterior of the shell 16 and is located along the shell 16 between the flared end 21 and the shoulder 20. The insulative body 2 holds the shell 16 in position within the hollow interior portion 6 of the body, with the recess 23 positioned in alignment with a corresponding opening 14.

The assembly 1 includes a hollow cylindrical insulative liner 24 for the shell 16. The liner 24 is assembled by insertion into the open end 8 of the insulative body 2 and into the flared end 21 of the shell 16. A rear end 25 of the liner 24 has a radially projecting external flange 26 that covers the flared end 21 of the shell 16, and has a radially outward projecting external shoulder 27 adjacent the flange 26 that engages the interior shoulder 22 of the shell 16 to limit insertion of the line 24.

Figure 2:
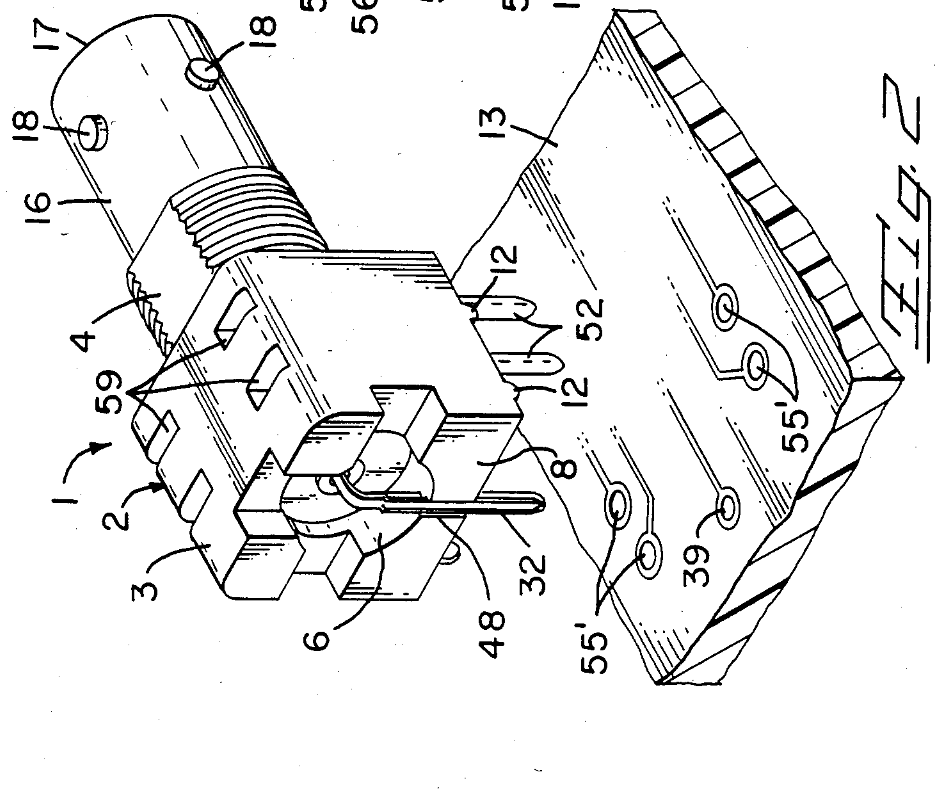
FIG. 2 is an enlarged fragmentary perspective view of a PCB, and further illustrating the parts shown in FIG. 1 assembled to form an electrical connector assembly.

As shown in FIGS. 1 through 3, the assembly 1 further includes a conductive electrical disconnect contact 28 formed by stamping a metal strip. The disconnect contact 28 has a disconnect contact portion 29 for disconnect connection with a known complementary electrical connector, not shown. The disconnect contact portion 29 is in the form of a hollow cylindrical electrical receptacle formed by bending the strip into a hollow cylindrical shape. The disconnect contact 28 has an elongated portion 30 in the plane of the strip and having tapered wedge barbs 31, 31 in the plane of the strip, and an electrical terminal 32 at the end of the strip formed by bending elongate edges of the strip out of the plane of the strip to form an elongated channel. As shown in FIGS. 1 and 3, the disconnect contact 28 is inserted concentrically into an open front end 33 of a hollow interior 34 of a cylindrical dielectric body 35. The disconnect contact portion 28 engages a radially projecting shoulder 36 of a cylindrical portion 37 of the interior 34, to limit insertion. The shoulder 36 is at an intersection with a passage 28 along which is disposed the elongated portion 30 of the contact 28. The barbs 31, 31 of the tapered wedge portions lodge in the interior 34 and resist withdrawal of the disconnect contact 28 from the interior 34. The electrical terminal 32 of the contact projects outwardly of the dielectric body 35 for insertion into an aperture 39 of the PCB 13.

The dielectric body 35 is inserted concentrically into an open front end 40 of a conductive intermediate shell 41. The front end 40 provides a disconnect connection to a complementary electrical connector, not shown. A hollow interior 42 of the intermediate shell 41 has a radially projecting shoulder 43 that engages an external radially outward projecting shoulder 44 on the dielectric body 35 to limit insertion. The intermediate shell 41 is assembled concentrically into the rear end 25 of the insulative liner 24. A rear end 45 of the intermediate shell 41 has an external radially projecting flange 46 that seats against the rear end 25 of the insulative liner 24. The insulative body 4 holds the intermediate shell 41 in position within the hollow interior portion 6 of the body 4. An external groove form recess 47 encircles the exterior of the flange 46 of the intermediate shell 41 and is positioned due to assembly with the body 4 in alignment with a corresponding opening 14. Following insertion of the intermediate shell 41, the terminal 32 of the contact 28 is bent as shown in FIG. 3 to project along a channel 48 that extends through the end 8 transversely of the axis of the dielectric body 2 and through the base 11.

Figure 4:
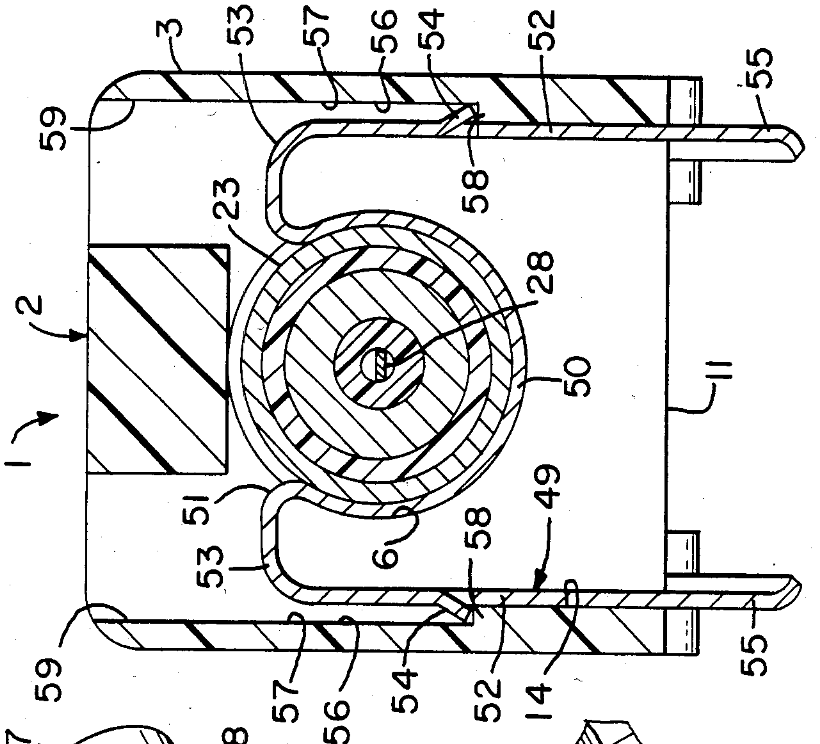
FIG. 4 is an enlarged cross section view of the assembly shown in FIG. 2, and taken generally along the line 4—4 of FIG. 3.

FIGS. 1, 3 and 4 show a pair of contacts 49, 49 of the same construction adapted for insertion along respective openings 14, 14. Each contact 49, 49 is formed as a unitary strip form clip of metal of constant thickness and width. The width of the contact 49 is perpendicular to its length and thickness. The strip form clip is curved along its length and transversely of its thickness to provide an arcuate holder 50 with an open side 51 of a length less than the diameter of the remainder of the holder 50. Elongated electrical terminals 52, 52 extend from opposite ends of the curved holder 50. As shown in FIG. 4, corresponding portions of the terminals extending from the holder form double back curved resilient springs 53, 53 that oppose each other across the open side 51. Tab latching portions 54, 54 are cut from the terminals 52, 52 and are bent to project diagonally from the thickness plane of the terminals 52, 52. Ends 55, 55 of the terminals 52, 52 are formed with elongated channels by bending elongate edges of the terminals out of the plane of the contact 49 to form edges of the channels. The ends 55, 55 are constructed for insertion into corresponding apertures 55', 55' of the PCB 13, and resilient spring energy residing in the terminals 54, 54 holds the terminals 54, 54 in the apertures 55', 55' until the terminals are joined to the PCB 13 with solder, not shown, Thus as described and shown in FIGS. 1, 3 and 4, the contacts 49, 49 are constructed as duplicates of each other.

FIG. 4 shows the construction of a corresponding opening 14 into which a contact 49 is inserted to establish an electrical connection with the outer shell 16. The opening 14 communicates with the base 11 and has an interior 56 of rectangular cross section with a width that slidably receives and confines the width of a corresponding contact 49. The contact 49 is inserted in the opening 14 and moved toward the shell 16, with the open side 51 of the holder 50 facing the shell 16. The terminals 52, 52 pivot toward each other during insertion, deflecting the springs 53, 53 and storing resilient spring energy therein. With reference to FIG. 4, the interior 56 of the opening 14 has clearance spaces 57, 57 defined between the interior 56 of the opening and corresponding springs 53, 53 of the terminals 52, 52 extending from the holder 50 to the latching portions 54, 54. The clearance spaces 57, 57 allow for resilient flexure of the springs 53, 53 away from each other such that the open side 51 of the holder 50 is lengthened in response to passage of exterior shell 16 through the open side 51 and into the confines of the holder 50. After passage of the exterior shell 16, the springs 53, 53 move toward each other to urge resiliently against the shell 16 in opposite directions, and to close the holder 50 frictionally in engagement on the exterior of the shell 16. The resilient spring energy urges the terminals 52, 52 to pivot away from each other and to impinge opposite sides of the interior 14. The latching portions 54, 54 are urged into the clearance spaces 57, 57.

Interior shoulders 58, 58 are provided at the intersection of the clearance spaces 57, 57 with the remainder of the interior 56. The latching portions 54, 54 of respective terminals 52, 52 project against respective shoulders 58, 58 to retain the corresponding contact 49 in the corresponding opening 14 and resist removal of the contact 49 from the opening 14. The clearance spaces 57, 57 communicate with corresponding passageways 59, 59 extending to the exterior of the body 2 and serving as access for a tool blade, not shown, for deflection of the latching portions 54, 54 away from the shoulders 58, 58, which disengages the contact 49 from the interior 56 of the opening 14 and allows withdrawal of the contact 49 from the opening 14.

FIG. 4 shows the recess 23 with a diameter conforming to the arcuate shape of a corresponding holder 50. The recess 23 has a width to receive and conform to the width of the holder 50. FIG. 3 shows the intermediate shell 41 and the exterior shell 16 with corresponding recesses 47, 23 having the same width, the same diameter dimension and positioned by the insulative body 2 similarly with respect to corresponding openings 14, 14 to connect with respective contact 49, 49 having the same construction.

Figure 5:
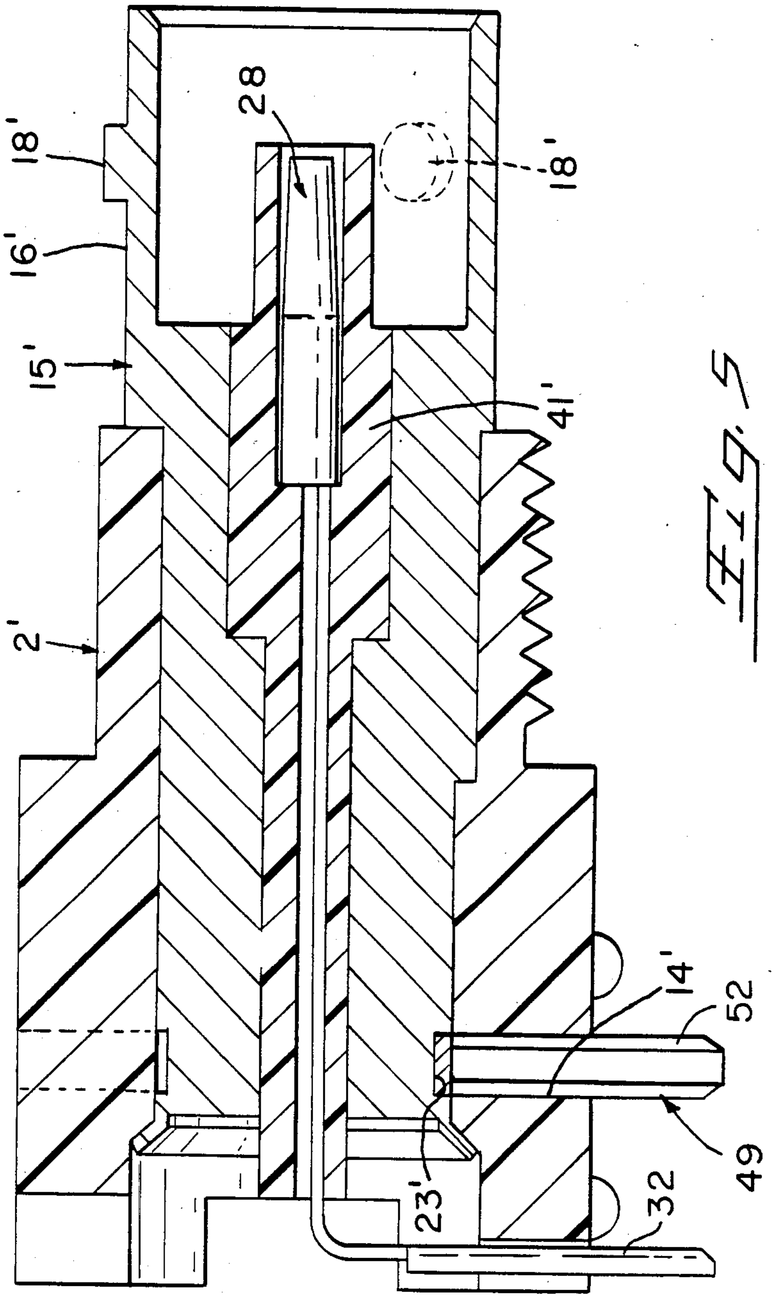
FIG. 5 is an enlarged longitudinal section view of an electrical connector assembly of coaxial configuration.

FIG. 5 illustrates an electrical connector assembly 1' including an insulative body 2' and a coaxial electrical connector 15'. The coaxial connector 15' includes the same disconnect contact 28 as the triaxial connector 15, and a conductive exterior shell 16' similar to the shell 16, with bayonet prongs 18', 18'. An insulative body 41' concentrically surrounds the disconnect contact 28 and, in turn is concentrically surrounded by the exterior shell 16'. A corresponding contact 49 of the type disclosed previously is inserted into a corresponding opening 14' of the body 2' and engages the exterior shell 16' in a recess 23' similar to the recess 23 of the shell 16.

FIGS. 6 through 9 of the drawings show an electrical connector assembly 100. An insulative body 102 of the assembly 100 if fabricated, for example, by moulding a polymeric plastics material, and includes a hollow rectangular portion 103 that is integral with a hollow cylindrical portion 104. External threads 105 are on the cylindrical portion 104 for establishing a threaded connection to a panel, now shown. The body 102 has a cylindrical hollow interior portion 106 extending axially through an open end 107 of the cylindrical portion 104 and through an open end 108 of the rectangular portion 103. A radially projecting interior shoulder 109 on the body 102 faces toward the open end 107 of the cylindrical portion 104. A radially inclined projecting interior shoulder 110 faces toward the open end 108 of the rectangular portion 103.

One exterior wall 111 of the rectangular portion 103 provides a base having projecting feet 112 for standing against a PCB 113. A pair of spaced apart openings 114, 114 of similar construction communicate with the wall 111 and the interior portion 106.

The assembly 100 further includes a triaxial electrical connector 115 having a hollow and conductive exterior shell 116 of stepped cylindrical form for assembly by insertion into the open end 107 of the cylindrical portion 104 of the body 102. The exterior shell 116 has a disconnect coupling portion 117 provided with bayonet coupling prongs 118 for disconnect coupling with a complementary electrical connector, not shown. The exterior shell 116 further has an exterior and radially projecting shoulder 119 engaged against the end 107 and a second exterior radially projecting shoulder 120 engaged against the interior shoulder 109 to limit the extent of insertion into the body 2. A flat recess 120' in the exterior shell 116 intercepts the shoulder 120.

Figure 6:
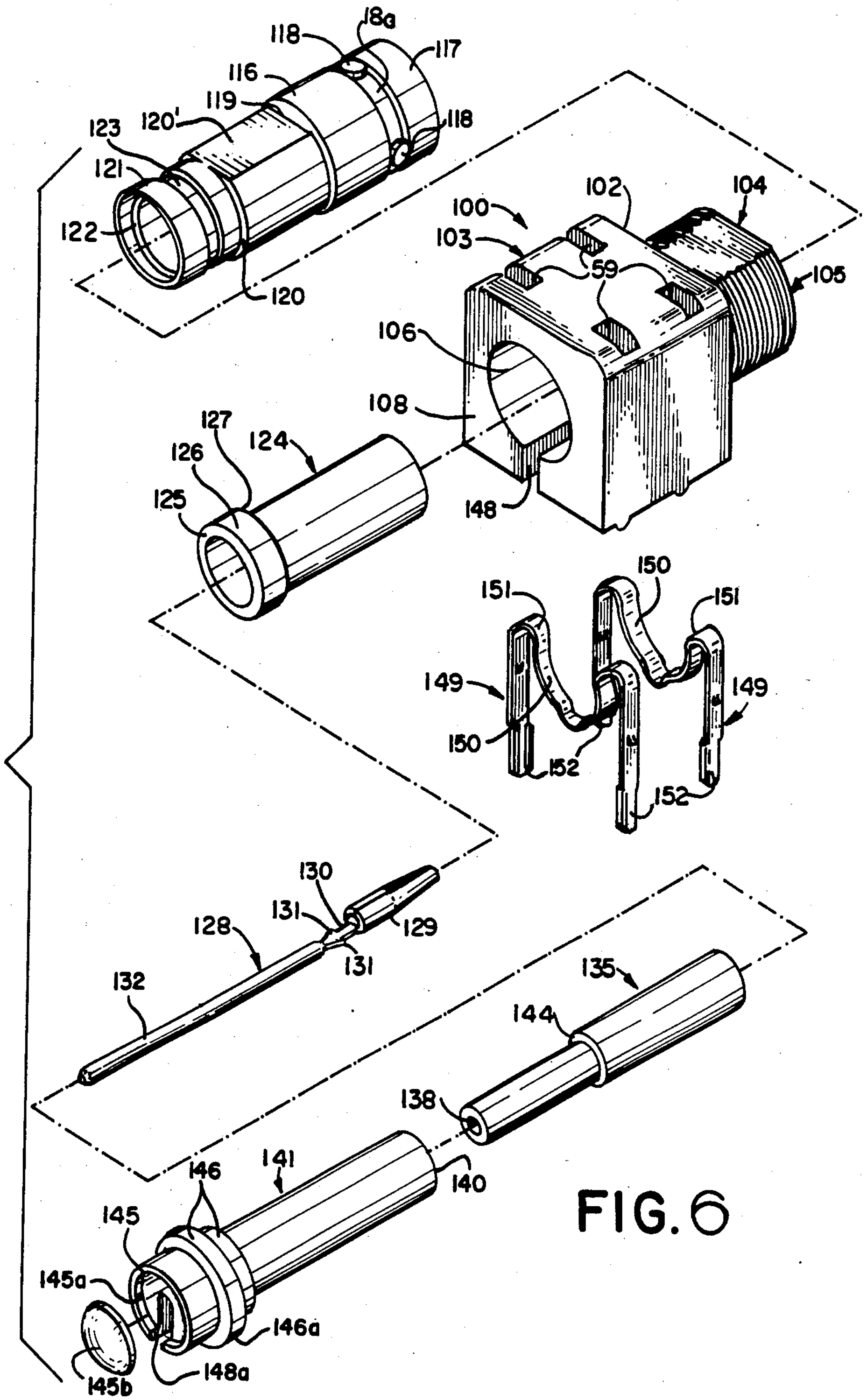
FIG. 6 is an enlarged perspective view of another electrical connector assembly of triaxial configuration and with parts shown exploded.
Figure 8:
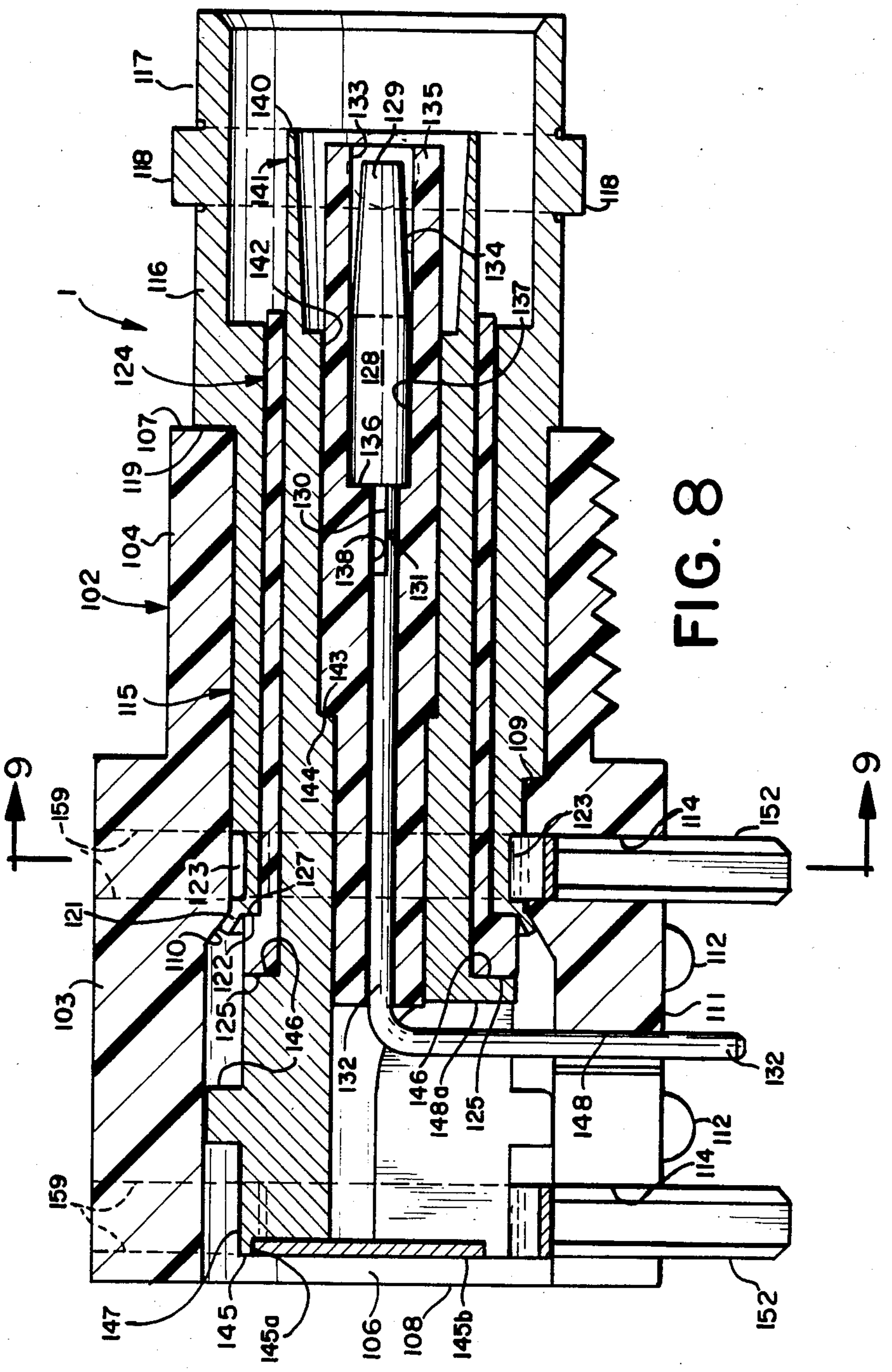
FIG. 8 is an enlarged longitudinal section view taken along the central axis of the assembly shown in FIG. 7.

As shown in FIG. 6, a rear end 121 of the shell 116 is of reduced cylindrical thickness and projects axially from an internal cylindrical shoulder 122 at the junction of the reduced thickness with the increased thickness of the remainder of the shell 116. As shown in FIG. 8, the rear end 121 is flared after insertion in the body 102 to form a radially outwardly flared lip engaged against the inclined shoulder 110 to prevent axial movement of the shell 116 toward the open end 107 of the cylindrical portion 4. A recess 123 of groove form encircles the cylindrical exterior of the shell 116 and is located along the shell 116 between the flared end 121 and the shoulder 120. The insulative body 102 holds the shell 116 in position within the hollow interior portion 106 of the body, with the recess 123 positioned in alignment with a corresponding opening 114.

The assembly 100 includes a hollow cylindrical insulative liner 124 for the shell 116. The liner 124 is assembled by insertion into the open end 108 of the insulative body 102 and into the flared end 121 of the shell 116. A rear end 125 of the liner 124 has a radially projecting external flange 126 that covers the flared end 121 of the shell 116, and has a radially outward projecting external shoulder 127 adjacent the flange 126 that engages the interior shoulder 122 of the shell 116 to limit insertion of the liner 124.

Figure 7:
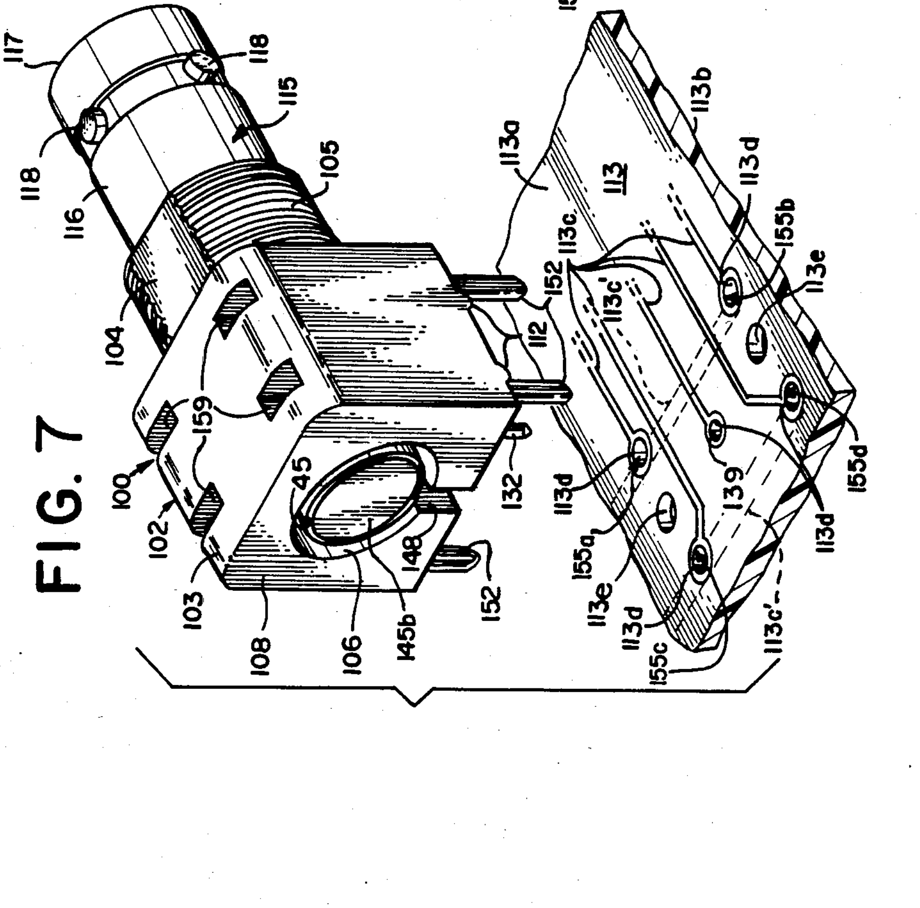
FIG. 7 is an enlarged fragmentary perspective view of a PCB and of the parts shown in FIG. 6 assembled to form an electrical connector assembly.

As shown in FIGS. 6 through 8, the assembly 100 further includes a conductive electrical disconnect contact 128 formed by stamping a metal strip. The disconnect contact 128 has a disconnect contact portion 129 for disconnect connection with a known complementary electrical connector, not shown. The disconnect contact portion 129 is in the form of a hollow cylindrical electrical receptacle formed by bending the strip into a hollow cylindrical shape. The disconnect contact 128 has an elongated portion 130 in the plane of the strip and having tapered wedge barbs 131, 131 in the plane of the strip, and an elongated tubular electrical terminal 132 at the end of the strip formed by bending elongate edges of the strip out of the plane of the strip to form an elongated tube. As shown in FIGS. 6 and 8, the disconnect contact 128 is inserted concentrically into an open front end 133 of a hollow interior 134 of a cylindrical dielectric body 135. The disconnect contact portion 128 engages a radially projecting shoulder 136 of a cylindrical portion 137 of the interior 134, to limit insertion. The shoulder 136 is at an intersection with a passage 138 along which is disposed the elongated portions 130 and 132 of the contact 128. The barbs 131, 131 of the tapered wedge portions lodge in the interior 234 and resist withdrawal of the disconnect contact 128 from the interior 134. The electrical terminal 132 of the contact projects outwardly of the dielectric body 135 for insertion into an aperture 139 of the PCB 113.

The dielectric body 135 is inserted concentrically into an open front end 140 of a conductive intermediate shell 141. The front end 140 provides a disconnect connection to a complementary electrical connector, not shown. A hollow interior 142 of the intermediate shell 141 has a radially projecting shoulder 143 that engages an external radially outward projecting shoulder 144 on the dielectric body 135 to limit insertion. The intermediate shell 141 is assembled by insertion concentrically into the rear end 125 of the insulative liner 124. A rear end 146 of the intermediate shell 141 has an external radially projecting flange 146 of stepped diameter. An end of the flange 146 seats against the rear end 125 of the insulative liner 124. Portion 146*a* of the flange 146 spans the interior 106 and provides a conductive barrier and electrical shield. The insulative body 104 holds the intermediate shell 141 in position within the hollow interior portion 106 of the body 104. The exterior of the flange 146 is provided with an external recess 147 that encircles the exterior of the flange 146 and is positioned due to assembly with the body 104 in alignment with a corresonding opening 114. Following insertion of the intermediate shell 141, the terminal 132 of the contact 128 is bent as shown in FIGS. 6 to 8 to project along a channel 148 that extends through the end 108 transversely of the axis of the dielectric body 102 and through the base 111. Similarly, the terminal 32 is bent to project along a channel 148*a* that extends laterally of the axis of the termination shell 141 and that communicates with the interior 142. FIGS. 6 and 8 show the rear end 145 having a cylindrical recess 146*a* communicating with the channel 148*a*. A thin conductive cap 146*b* initially of bulbous form is inserted into the recess 145*a* and its bulbous form is flattened by the application of pressure thereon causing the cap 145*b* to expand radially and span the recess 145*a* and frictionally engage the side of the recess to be retained in place and electrically shield the terminal 132.

Figure 9:
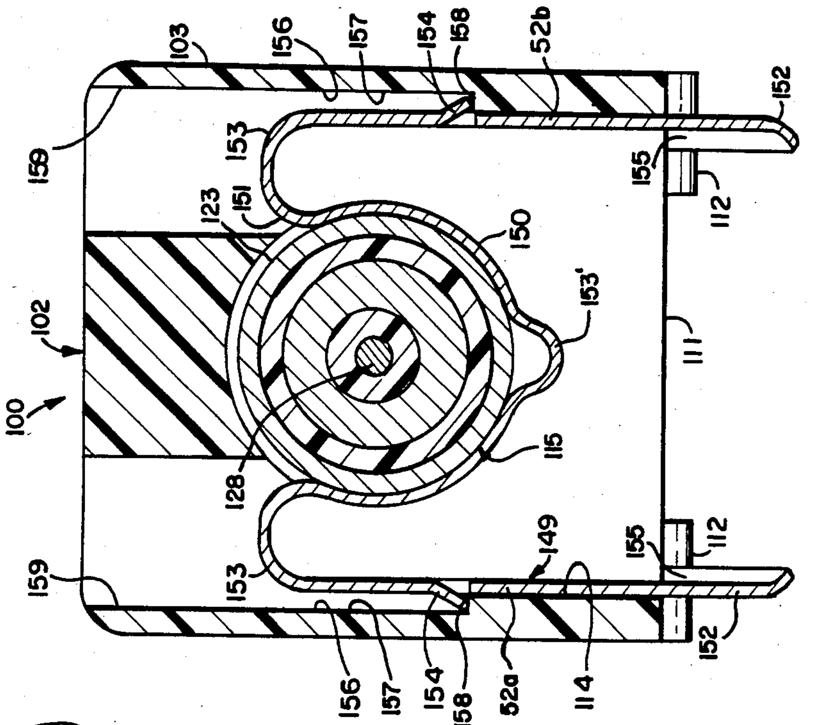
FIG. 9 is an enlarged cross section view taken along the line 9—9 of FIG. 8.

FIGS. 6, 7 and 9 show a pair of contacts 149, 149 of the same construction adapted for insertion along respective openings 114, 114. Each contact 149, 149 is formed as a unitary strip form clip of metal of constant thickness and width. The width of the contact 149 is perpendicular to its length and thickness. The strip form clip is curved along its length and transversely of its thickness to provide an arcuate holder 150 with an open side 151 of a length less than the diameter of the remainder of the holder 150. Elongated electrical terminals 152, 152 extend from opposite ends of the curved holder 50. As shown in FIG. 9, corresponding portions of the terminals extending from the holder form doubled back curved resilient springs 153, 153 that oppose each other across the open side 151. The holder 150 includes an outwardly projecting bight 153' spaced equally between and along the holder 150 from the springs 153, 153 and extending the length of each spring 153, 153 over which resilient flexure is distributed. Tab latching portions 154, 154 are cut from the terminals 152, 152 and are bent to project diagonally from the thickness plane of the terminals 152, 152. Ends 155, 155 of the terminals 152, 152 are formed with elongated channels by bending elongate edges of the terminals out of the plane of the contact 149 to form edges of the channels. The ends 155, 155 are constructed for insertion into corresponding apertures 155*a*, 155*b*, 155*c*, 155*d* of the PCB 113, and resilient spring energy residing in the terminals 154, 154 holds the terminals 154, 154 in the apertures 155*a*, 155*b*, 155*c*, 155*d* until the terminals are joined to the PCB 113 with solder, not shown.

FIG. 9 shows the construction of a corresonding opening 114 into which a contact 149 is inserted to establish an electrical connection with the outer shell 116. The opening 114 communicates with the base 111 and has an interior 156 of rectangular cross section with a width that slidably receives and confines the width of a corresponding contact 149. The contact 149 is inserted in the opening 114 and moved toward the shell 116, with the open side 151 of the holder 150 facing the shell 116. The terminals 152, 152 pivot toward each other during insertion, deflecting the springs 153, 153 and storing resilient spring energy therein. With reference to FIG. 9, the interior 156 of the opening 114 has clearance spaces 157, 157 defined between the interior 156 of the opening and corresponding springs 153, 153 of the terminals 152, 152 extending from the holder 150 to the latching portions 154, 154. The clearance spaces 157, 157 allow for resilient flexure of the springs 153, 153 away from each other, pivoting about the bight 153', such that the open side 151 of the holder 150 is lengthened in response to passage of exterior shell 116 through the open side 151 and into the confines of the holder 150. After passage of the exterior shell 16, the springs 153, 153 move toward each other to urge resiliently against the shell 116 in opposite directions, and to close the holder 150 frictionally in engagement on the exterior of the shell 116. The bight 153' remains outwardly spaced from the shell 116. The resilient spring energy urges the terminals 152, 152 to pivot away from each other and to impinge opposite sides of the interior 114. The latching portions 154, 154 are urged into the clearance spaces 157, 157.

Interior shoulders 158, 159 are provided at the intersection of the clearance spaces 157, 157 with the remainder of the interior 156. The latching portions 154, 154 of respective terminals 152, 152 project against respective shoulders 158, 158 to retain the corresponding contact 149 in the corresponding opening 114 and resist removal of the contact 149 from the opening 114.

The clearance spaces 157, 157 communicate with corresponding passageways 159, 159 extending to the exterior of the body 102 and serving as access for a tool blade, not shown, for deflection of the latching portions 154, 154 away from the shoulder 158, 158, which disengages the contact 149 from the interior 156 of the opening 114 and allows withdrawal of the contact 149 from the opening 114.

FIG. 9 shows the recess 123 with a diameter conforming to the arcuate shape of a corresponding holder 150. The recess 123 has a width to receive and conform to the width of the holder 150. FIG. 8 shows the intermediate shell 141 and the exterior shell 116 with corresponding recesses 123 and 147 having the same width, the same diameter dimension and positioned by the insulative body 102 similarly with respect to corresponding openings 114, 114 to connect with respective contacts 149, 149 having the same construction.

The terminals 139, 152, 152, 152, 152 are spaced apart and project outwardly from the connector 115 in a common directon and are arranged in a pattern wherein the terminal 132 is surrounded or circumscribed by and spaced equidistant from the other terminals 152, 152, 152, 152 that are spaced apart to form a square shaped portion of the pattern and that provide electrical shunts for absorbing radiant electrical energy in the form of electrical signals emitted from the circumscribed terminal 132, or in the form of electrical interference that would interfere with electrical signals transmitted along the circumscribed terminal 132.

The PCB 113 includes first and second parallel surfaces 113*a* and 113*b*. The apertures 139, 155*a*, 155*b*, 155*c*, 155*d* are spaced apart, extend through the thickness of the PCB 113 and communicate with the surfaces 113*a* and 113*b*. Conductive means are in the form of elongated electrical circuit paths 113*c*, 113*c*, 113*c*, 113*c* adhered to the surface 113*a* and elongated electrical circuit paths 113*c*′, 113*c*′ adhered to the surface 113*b*. The conductive means 113*c*, 113*c*, 113*c*, 113*c*, 113*c*, 113*c*′, 113*c*′ join corresponding additional conductive means 113*d*, 113*d*, 113*d*, 113*d*, 113*d* in the form of conductive walls lining the corresponding apertures 139, 155*a*, 155*b*, 155*c*, 155*d*. A first aperture 139 is constructed to receive the electrical terminal 132 of the contact 128. The apertures 155*a* and 155*b* receive the terminals 152, 152 connected to the external shell 116, and the apertures 155*c*, 155*d* receive the terminals 152, 152 connected to the intermediate shell 141. The apertures 139, 155*a*, 155*b*, 155*c*, 155*d* are spaced apart from one another and are arranged in a pattern wherein the first aperture 139 is surrounded or circumscribed by the other apertures 155*a*, 155*b*, 155*c*, 155*d* of the pattern. The conductive walls 113*d*, 113*d*, 113*d*, 113*d* of the corresponding apertures 152*a*, 152*b*, 152*c*, 152*d* are arranged by the pattern to provide electrical shunts for radiated electrical energy in the form of electrical signals emanating from the conductive wall 113*d* of the circumscribed aperture 139 or from the terminal 132, or in the form of electrical interference that interferes, or would interfere, with the electrical signals transmitted along the wall 113*d* of the circumscribed aperture 139 or along the terminal 132.

The circuit paths 113*c*, 113*c*, 113*c*, 113*c*, 113*c* are elongated in the same direction and are arranged in a pattern wherein the circuit path 113*c* connected to the wall 113*d* of the aperture 139 is circumscribed on the surface 113*b* by the circuit paths 113*c*′, 113*c*′, and on the surface 113*a* by the circuit paths 113*c*, 113*c*, 113*c*, 113*c* connected to corresponding walls 113*d*, 113*d*, 113*d*, 113*d* of corresponding apertures 155*a*, 155*b*, 155*c*, 155*d*, which circuit paths 113*c*′, 113*c*′, 113*c*, 113*c*, 113*c*, 113*c*, provide electrical shunts for radiated electrical energy in the form of electrical signals emanating from the conductive wall 113*d* of the circumscribed aperture 139 or from the terminal 132, or in the form of electrical interference that interferes, or would interfere, with the electrical signals transmitted along the wall 113*d* of the circumscribed aperture 139 or along the terminal 132.

A distance of 0.400 inches (10.16 cm.) separates the centerline spacing between apertures 155*a* and 155*b*, and between the terminals 152, 152 of the contact 149 connected to the intermediate shell 141. A distance of 0.400 inches (10.16 cm.) separates the centerline spacing between apertures 155*c* and 155*d*, and between the terminals 152, 152 of the contact 149 connected to the external shell 116. The aperture 139 is equidistant from the apertures 159*a*, 159*b*, 159*c*, 159*d* that are arranged in a square shaped portion of the pattern. As shown in FIG. 7, openings 113*e*, 113*d* are provided through the thickness of the PCB 113 for receipt of threaded fasteners, not shown, for threaded connection with the insulative body 102.

Although preferrerd embodiments have been described and shown, other embodiments and modifications are intended to be covered by the spirit and scope of the claims.

We claim:

1. In an electrical connector assembly comprising, an insulative body having a base, an electrical connector encircled by the insulative body and having a conductive exterior shell with a disconnect coupling portion, and having an electrical disconnect contact with an electrical disconnect contact portion and an electrical terminal projecting outwardly from the base, the body holding and positioning the connector within a hollow interior portion of the body, an opening in the body communicating with the hollow interior, an electrical contact constructed for insertion along the opening toward the connector and into engagement with the shell, and electrical terminals extending from the holder, at least one these terminals projecting outwardly from the base, the improvement comprising;

the electrical contact includes an elongated holder shaped along its length to conform to and engage against the exterior of the shell, the holder has an open side for receiving passage of the exterior of the shell, and the opening in the body is constructed with a cross section to receive passage of the holder transversely of its length and toward the conductor in the hollow interior with the open side of the holder facing the shell.

2. An electrical connector assembly as recited in claim 1, wherein, the terminals extending from the holder have latching portions latched to the insulative body, and clearance spaces are defined between the openings of the insulative body and corresponding portions of the terminals extending from the holder to the latching portions.

3. An electrical connector assembly as recited in claim 1, wherein, corresponding portions of the terminals extending from the holder are curved resilient springs urging resiliently against the shell in opposite directions.

4. An electrical connector assembly as recited in claim 1, wherein, the exterior shell has a recess receiving the holder, and the recess is aligned with said opening in the body.

5. An electrical connector assembly as recited in claim 1, wherein, the connector includes a conductive intermediate shell that has a disconnect intermediate coupling portion and is concentrically within the exterior shell and separated from the exterior shell by a layer of dielectric material, and a second electrical contact has a corresponding second holder engaging the intermediate shell, corresponding electrical terminals extend from the second holder, and at least one of the corresponding electrical terminals projects outwardly from the base.

6. An electrical connector assembly as recited in claim 5, wherein, the body has a second opening extending through the base, with a width of the second opening constructed for receiving the width of the second holder and the width of the terminals extending from the second holder.

7. An electrical connector assembly as recited in claim 5, wherein, the terminals extending from the second holder have latching portions latched to the insulative body, and clearance spaces are defined between the second opening in the insulative body and corresponding portions of the terminals extending from the second holder to the corresponding latching portions of the second contact.

8. An electrical connector assembly as recited in claim 5, wherein, corresponding portions of the terminals extending from the second holder are curved resilient springs urging resiliently against the intermediate shell in opposite directions.

9. An electrical connector assembly as recited in claim 5, wherein, a portion of the intermediate shell projects outwardly from the external shell and said portion engages the second holder.

10. An electrical connector assembly as recited in claim 5, wherein, the external shell and the intermediate shell are constructed for conforming to the shape of respective said contacts, and said contacts are constructed as duplicates of each other.

11. An electrical connector as recited in claim 5, wherein an end of the exterior shell extends beyond an end of the intermediate shell, and a conductive cap covers an opening in another end of the intermediate shell.

12. In a combination of a triaxial electrical connector assembly and a printed circuit board having apertures provided with conductive walls for electrical connection to corresponding electrical terminals of the connector assembly the connector assembly having a conductive exterior shell connected to a first two of the electrical terminals, an insulative liner encircled by the exterior shell, a conductive interior shell encircled by the liner and connected to a second two of the electrical terminals, a dielectric body encircled by the interior shell, an electrical disconnect contact encircled by the dielectric body and having a third of the electrical terminals, the improvement comprising;

said apertures are spaced apart from one another and arranged in a pattern wherein a first set of two of the apertures and a second set of two of the apertures surround a third of the apertures, the first set of apertures receive therein corresponding electrical terminals connected to the external shell, the second set of apertures receive therein corresponding electrical terminals connected to the interior shell, a first set of electrical circuit paths on the printed circuit board are connected to corresponding conductive walls within the first set of apertures, a second set of electrical circuit paths on the printed circuit board are connected to corresponding conductive walls within the second set of apertures, a third electrical circuit path on the printed circuit board is connected to a corresponding conductive wall within the third aperture, and the first set and the second set of circuit paths circumscribe the third electrical circuit path and provide electrical shunts for radiated electrical energy that would be transmitted to or from the third terminal or to or from the conductive wall within the third aperture.

13. In a combination as recited in claim 12, the improvement further comprising, said third aperture is equidistant from each of said other apertures.

14. In a combination as recited in claim 12, the improvement comprising; equal spaces separating adjacent said apertures of the first and the second sets of apertures.

15. An electrical connector assembly comprising, an insulative body having a hollow interior and a base, an electrical connector in the hollow interior and having first and second conductive shells with corresponding disconnect coupling portions, and having an electrical disconnect contact with an electrical disconnect contact portion and an electrical terminal projecting outwardly rom the base, first and second openings in the insulative body communicating with the hollow interior, electrical contacts in corresponding openings and engaging corresponding shells and having electrical terminals extending outwardly from the openings and from the base, the electrical terminals being spaced apart from one another, the electrical terminals of the disconnect contact being surrounded by the terminals of the electrical contacts, an end of the first conductive shell extends beyond an end of the second conductive shell, and a conductive cap covers an opening in the end of the first conductive shell.

* * * * *